United States Patent
Chan et al.

(10) Patent No.: US 12,046,506 B2
(45) Date of Patent: Jul. 23, 2024

(54) DEVICES WITH REDUCED CAPACITANCES

(71) Applicant: Taiwan Semiconductor Manufacturing Company, Ltd., Hsinchu (TW)

(72) Inventors: Yu-Hsin Chan, Hsinchu (TW); Cai-Ling Wu, Hsinchu (TW); Chang-Wen Chen, Hsinchu (TW); Po-Hsiang Huang, Taipei (TW); Yu-Yu Chen, Hsinchu (TW); Kuan-Wei Huang, Taoyuan County (TW); Jr-Hung Li, Hsinchu County (TW); Jay Chiu, Hsinchu (TW); Ting-Kui Chang, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 186 days.

(21) Appl. No.: 17/382,873

(22) Filed: Jul. 22, 2021

(65) Prior Publication Data
US 2022/0359263 A1    Nov. 10, 2022

Related U.S. Application Data

(60) Provisional application No. 63/185,694, filed on May 7, 2021.

(51) Int. Cl.
*H01L 21/768* (2006.01)
*H01L 23/522* (2006.01)
*H01L 23/532* (2006.01)
*H01L 29/417* (2006.01)

(52) U.S. Cl.
CPC .... *H01L 21/7682* (2013.01); *H01L 21/76831* (2013.01); *H01L 21/76834* (2013.01); *H01L 21/7684* (2013.01); *H01L 21/76843* (2013.01); *H01L 21/76852* (2013.01); *H01L 21/76885* (2013.01); *H01L 23/5222* (2013.01); *H01L 23/53295* (2013.01); *H01L 29/41725* (2013.01)

(58) Field of Classification Search
CPC ........... H01L 21/7682; H01L 21/76885; H01L 21/76831; H01L 21/76834; H01L 21/7688
See application file for complete search history.

(56) References Cited

U.S. PATENT DOCUMENTS

| | | | |
|---|---|---|---|
| 8,310,053 B2 * | 11/2012 | Verheijden | ........ H01L 21/31116 257/E21.271 |
| 9,379,009 B2 * | 6/2016 | Rho | ................. H01L 21/76846 |
| 9,520,362 B2 | 12/2016 | Lin et al. | |
| 9,613,856 B1 | 4/2017 | Yang et al. | |

(Continued)

*Primary Examiner* — Daniel Luke
(74) *Attorney, Agent, or Firm* — Haynes and Boone, LLP

(57) ABSTRACT

In one example aspect, the present disclosure is directed to a method. The method includes receiving a workpiece having a conductive feature over a semiconductor substrate, forming a sacrificial material layer over the conductive feature, removing first portions of the sacrificial material layer to form line trenches and to expose a top surface of the conductive feature in one of the line trenches; forming line features in the line trenches, removing second portions of the sacrificial material layer to form gaps between the line features, and forming dielectric features in the gaps, the dielectric features enclosing an air gap.

20 Claims, 14 Drawing Sheets

(56) References Cited

U.S. PATENT DOCUMENTS

| | | | |
|---|---|---|---|
| 9,716,032 B2 | 7/2017 | Tang et al. | |
| 9,847,249 B2 * | 12/2017 | Takahashi | H01L 21/0217 |
| 9,972,529 B2 | 5/2018 | Yang et al. | |
| 10,163,691 B2 | 12/2018 | Shih et al. | |
| 10,170,322 B1 | 1/2019 | Cheng et al. | |
| 10,903,111 B2 * | 1/2021 | Joseph Varghese | H01L 21/76834 |
| 2012/0319279 A1 * | 12/2012 | Isobayashi | H01L 23/53238 |
| | | | 438/653 |
| 2016/0204059 A1 * | 7/2016 | Fukuo | H01L 21/76834 |
| | | | 257/773 |

* cited by examiner

DEVICES WITH REDUCED CAPACITANCES

PRIORITY DATA

This application claims priority to U.S. Provisional Patent Application No. 63/185,694, filed on May 7, 2021, entitled "Device with Reduced Capacitances", the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of IC processing and manufacturing, and for these advancements to be realized, similar developments in IC processing and manufacturing are needed. For example, capacitances between adjacent metal lines increase as the pitch shrinks. Such capacitance increase has been shown to lead to degraded device speeds. Accordingly, although existing interconnect technologies are generally adequate for their intended purposes, they are not satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
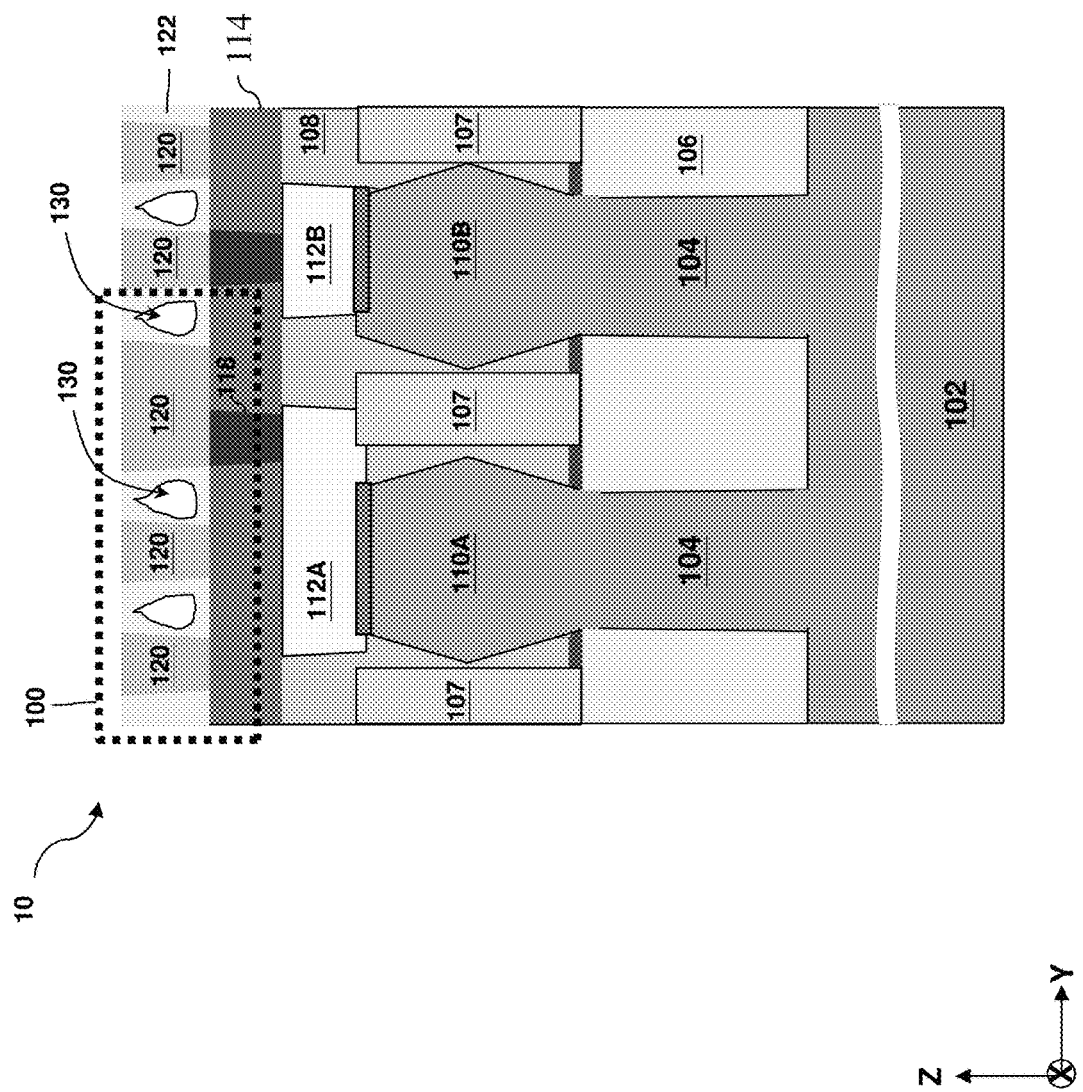
FIG. 1 is a cross-sectional view of an IC device, in portions or in entirety, according to some aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" may encompass the dimension range from 4.5 nm to 5.5 nm.

The present disclosure is generally related to ICs and semiconductor devices and methods of forming the same. More particularly, the present disclosure is related to semiconductor devices with reduced capacitances, for example, in the back end of line (BEOL). One aspect of the present disclosure involves forming improved interconnect structures with reduced capacitances. As semiconductor fabrication progresses to ever smaller technology nodes, the increase in capacitances in the interconnect structures (such as between adjacent metal lines) may begin to seriously degrade device performance, such as leading to reduced device speed. Accordingly, this present disclosure provides method to reduce such capacitances without excessive cost increases. In some embodiments, devices implementing the structures and methods described here may realize a capacitance reduction of about 10% or more.

FIG. 1 illustrates a cross-sectional view of an IC device 10 (for example, in an Y-Z plane) according to various aspects of the present disclosure. The Y-Z plane is a plane defined by the Y-direction and the Z-direction. In that regard, X-direction and Y-direction are horizontal directions that are perpendicular to each other; and the Z-direction is a vertical direction perpendicular to the X-Y plane. The IC device 10 may be an intermediate device fabricated during processing of an IC, or a portion thereof, that may comprise static random-access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, and/or other memory cells. The present disclosure is not limited to any particular number of devices or device regions, or to any particular device configurations, unless otherwise claimed. For example, the IC device 10 may apply to three-dimensional FinFET devices, as well as to planar FET devices. Additionally, the IC device may apply to multi-gate devices, such as those known as gate-all-around (GAA) devices, multi-bridge-channel (MBC) devices, surrounding gate transistor (SGT), or other multi-gate devices.

FIG. 1 illustrates one example IC device 10 of the present disclosure. The IC device 10 includes a substrate 102. The substrate 102 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 102 may be a single-layer material having a uniform composition. Alternatively, the substrate 102 may include multiple material layers having similar or different compositions suitable for IC device manufacturing. In one example, the substrate 102 may be a silicon-on-insulator (SOI) substrate having a semiconductor silicon layer formed on a silicon oxide layer. In another example, the substrate 102 may include a conductive layer, a semiconductor layer, a dielectric layer, other layers, or combinations thereof. Various doped regions (such as source regions and drain regions) may be formed in or on the substrate 102. The doped regions may be doped with n-type dopants, such as phosphorus or arsenic, and/or p-type dopants, such as boron or indium, depending on design requirements. The doped regions may be formed directly on the substrate 102, in a p-well structure, in an n-well structure, in a dual-well structure, or using a raised structure. Doped regions may be formed by implantation of dopant atoms, in-situ doped epitaxial growth, and/or other suitable techniques.

The IC device 10 also includes active regions 104. In some embodiments, the active regions 104 are elongated fin-like structures that protrude upwardly out of the substrate 102 (for example, along the Z-direction). As such, the active regions 104 may be interchangeably referred to as fins 104 or fin structures 104 hereinafter. The fin structures 104 are oriented lengthwise along the X-direction. The fin structures 104 may be fabricated using suitable processes including photolithography and etch processes. The photolithography process may include forming a photoresist layer overlying the substrate 102, exposing the photoresist to a pattern, performing post-exposure bake processes, and developing the photoresist to form a masking element (not shown) including the resist. The masking element is then used for etching recesses into the substrate 102, leaving the fin structures 104 on the substrate 102. The etching process may include dry etching, wet etching, reactive ion etching (RIE), and/or other suitable processes. In some embodiments, the fin structure 104 may be formed by double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. As an example, a layer may be formed over a substrate and patterned using a photolithography process. Spacers are formed alongside the patterned layer using a self-aligned process. The layer is then removed, and the remaining spacers, or mandrels, may then be used to pattern the fin structures 104.

The IC device 10 further includes the isolation structures 106. The isolation structures 106 electrically separate various components of the IC device 10. The isolation structures 106 may include silicon oxide, silicon nitride, silicon oxynitride, fluoride-doped silicate glass (FSG), a low-k dielectric material, and/or other suitable materials. In some embodiments, the isolation structures 106 may include shallow trench isolation (STI) features. In one embodiment, the isolation structures 106 are formed by etching trenches in the substrate 102 during the formation of the fin structures 104. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation structures 106. Alternatively, the isolation structures 106 may include a multi-layer structure, for example, having one or more thermal oxide liner layers.

Gate structures are formed over the fin structures 104. Because the gate structures are formed on planes offset from the Y-Z cross-section illustrated in FIG. 1, FIG. 1 does not explicitly depict the gate structures. The gate structures may include gate stacks and gate spacers adjacent the gate stacks. The gate stacks may be, for example, high-k metal gate (HKMG) stacks that contain a high-k gate dielectric and a metal gate electrode. The IC device 10 additionally includes source/drain features 110A, 110B formed on the fin structures 104 and on sides of the gate structures. In some embodiments, the fin structures 104 are recessed in the source/drain regions, where source/drain features 110A, 110B are subsequently formed using, for example, epitaxial growth methods. In some embodiments, the source/drain features 110A, 110B may be formed over (or "merges over") two adjacent fin structures 104. The IC device 10 also includes dielectric fin structures 107 extending along the X-direction and between adjacent fin structures 104. The dielectric fin structures 107 isolates adjacent source/drain features 110A, 110B.

The IC device 10 additionally includes an interlayer dielectric (ILD) layer 108 over the isolation structures 106, such that the top portions of the fin structures 104 are embedded within the ILD layer 108. Moreover, the gate structures, the source/drain features 110A, 110B are also at least partially embedded within the ILD layer 108. The ILD layer 108 may include any suitable materials, such as SiCN, SiOCN, SiON, metal oxides, or combinations thereof.

The IC device 10 further includes various contact features 112A, 112B (such as source/drain contact features MD) formed on the source/drain features 110A, 110B, respectively. For example, an etching process is employed to remove portions of the ILD layer 108 to form contact trenches, such that the source/drain 110A, 110B are exposed in the contact trenches. A deposition process is then implemented to form contact features 112A, 112B that interface with the source/drain features 110A, 110B, respectively. In some embodiments, silicide layers are formed between the contact features 112A, 112B and the source/drain features 110A, 110B, respectively.

The IC device further includes an ILD layer 114 through which via structures 118 are formed to connect to the contact features 112A, 112B. The via structures 118 may be formed by any suitable methods. For example, a via metal material is deposited into the via trenches with, for example, a Chemical Vapor Deposition (CVD) method, an Atomic Layer Deposition (ALD) method or the like. A CMP process is then employed to remove excess materials and planarize the top surface. The via metal material may be any suitable metal materials, such as cobalt (Co), ruthenium (Ru), copper (Cu), tantalum (Ta), titanium (Ti), iridium (Jr), tungsten (W), aluminum (Al), tantalum nitride (TaN), titanium nitride (TiN), other suitable metals, or combinations thereof.

Furthermore, the IC device includes a plurality of metal lines 120 embedded within a dielectric layer 122 over the dielectric layer 114. One of the metal lines 120 is connected to via structure 118. Furthermore, air gaps 130 are formed between adjacent metal lines 120 and within the dielectric layer 122. As described in detail below, the presence of air gaps 130 reduces the capacitances and improves device performances, such as speeds. These contact features, via structures, and metal lines form part of a multi-layer interconnect (MLI) structure that electrically connects the source/drain features 110A to various other components of the IC device 10 and/or external voltages. Additional layers may be formed above the dielectric layer 122 and the metal lines 120 to form additional portions of the MLI structure. Such additional portions may further include air gaps, similar to the air gaps 130. Due to space considerations, FIG. 1 does not specifically illustrate all features of the IC device 10. Certain features are illustrated in detail in subsequent figures. In that regard, FIGS. 2-13 are expanded cross-sectional views of a portion 100 of the IC device 10 at different processing stages leading up to the configuration of FIG. 1. Additionally, FIG. 14 is a flowchart illustrating a method of forming the IC device 10.

Figure 2:
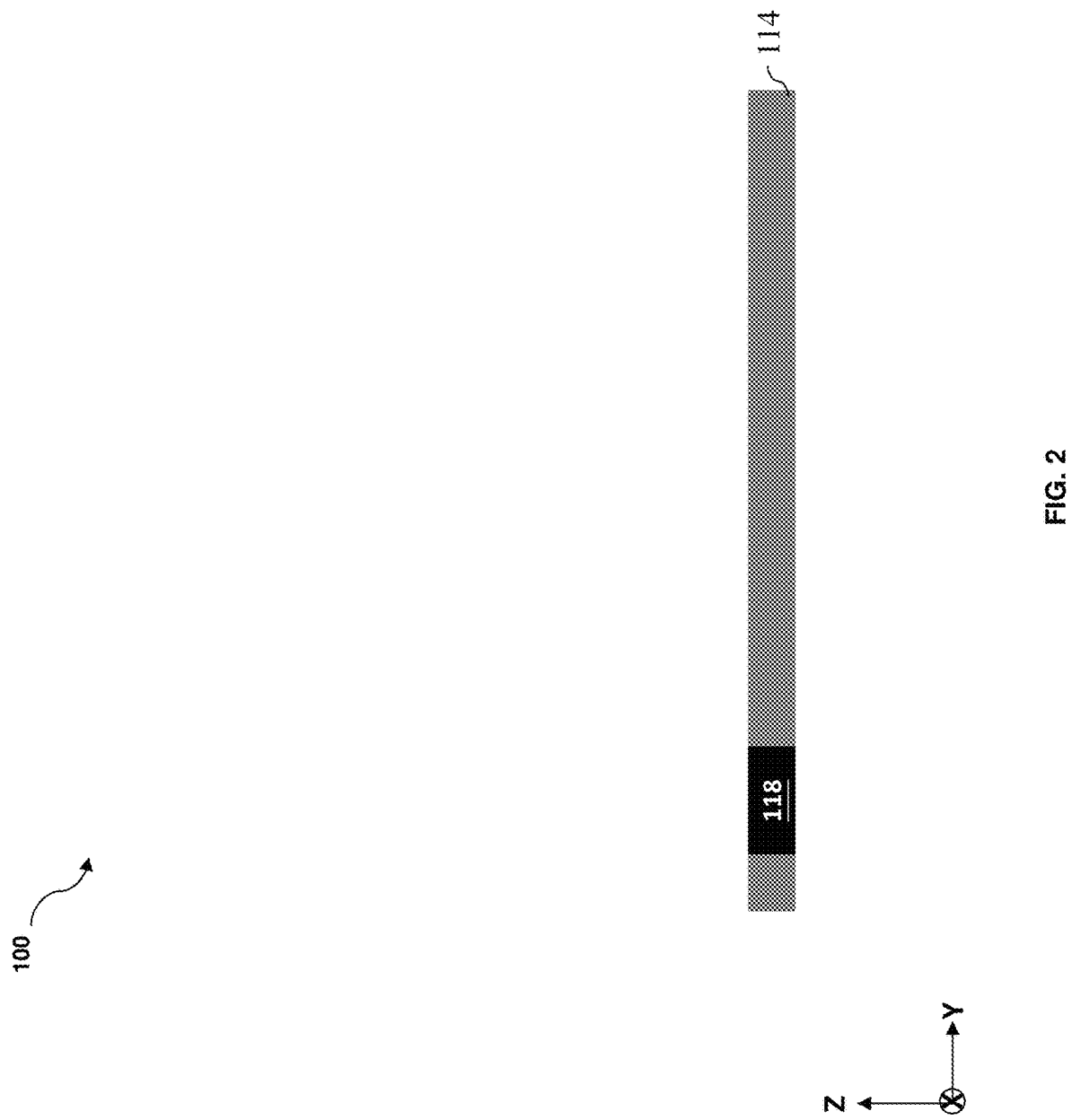
FIGS. 2, 3, 4, 5, 6, 7, 8, 9, 10, 11, 12, and 13 are expanded views of portions of the IC device of FIG. 1, at different processing stages, according to some aspects of the present disclosure.
Figure 14:
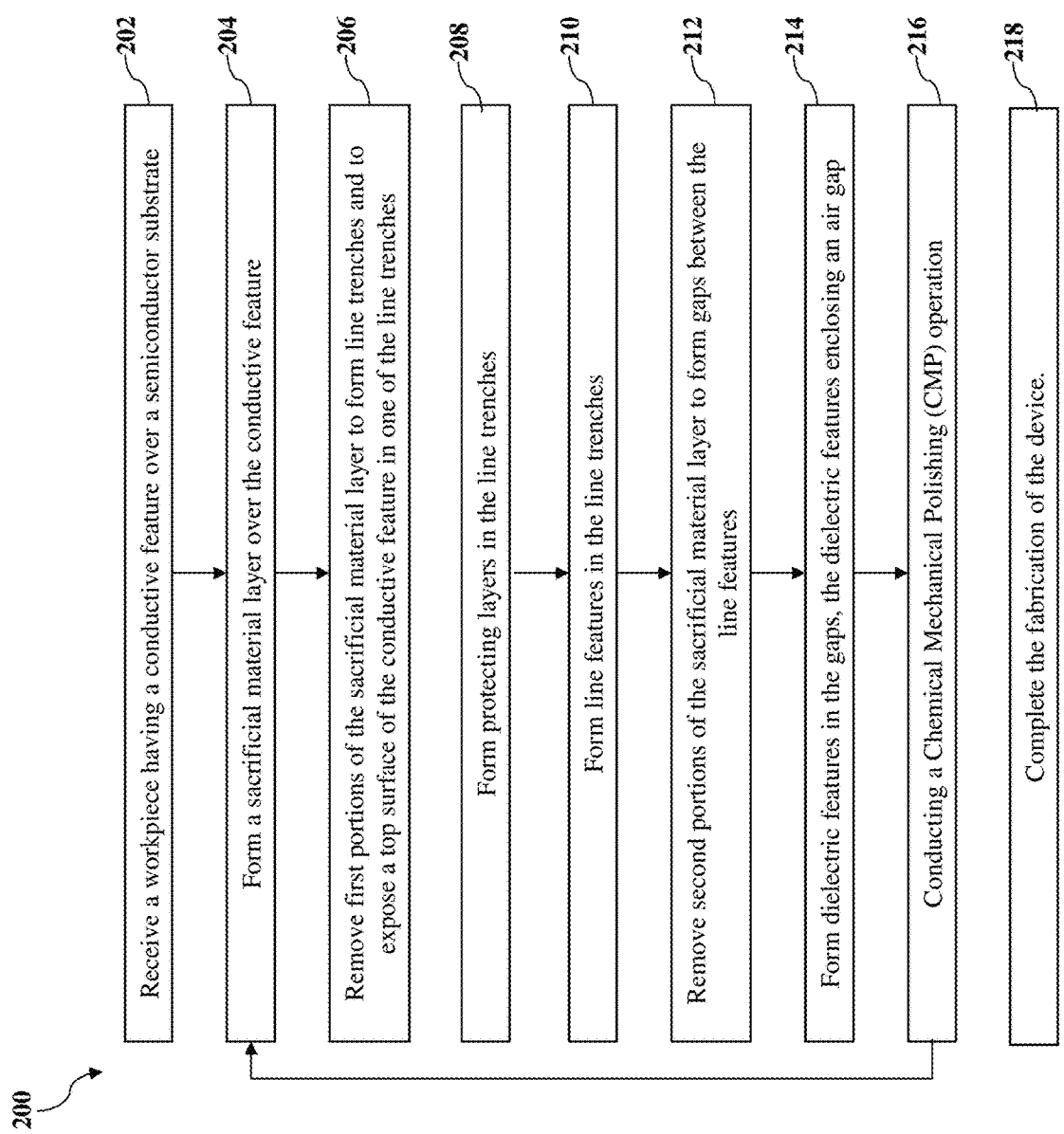
FIG. 14 is a flowchart of a method of fabricating a semiconductor device according to various aspects of the present disclosure.

Referring to FIG. 2 and block 202 of FIG. 14, an initial structure of the IC device 10 is received. The initial structure is a predecessor to the IC device 10 illustrated in FIG. 1. For example, the initial structure includes all features 102, 104, 106, 107, 108, 110A, 110B, 112A, 112B, 114, and 118, as depicted in FIG. 1, already formed by any suitable methods. However, at this processing stage, the portion 100 of FIG. 1 has not been completed. Specifically, FIG. 2 illustrates the portion 100 of initial structure of the IC device 10 at this processing stage. As illustrated, the portion 100 includes the via structure 118 embedded within a dielectric layer 114. The via structure 118 includes any suitable conductive materials, such as copper, tungsten, aluminum, gold, silver, other suitable materials, or combinations thereof. In some embodiments, the dielectric layer 114 includes any suitable dielectric materials, such as silicon oxide, plasma-enhanced silicon oxide (PEOX), silicon nitride, silicon oxynitride, fluoride-doped silicate glass (FSG), a low-k dielectric material, and/or other suitable materials.

Figure 3:
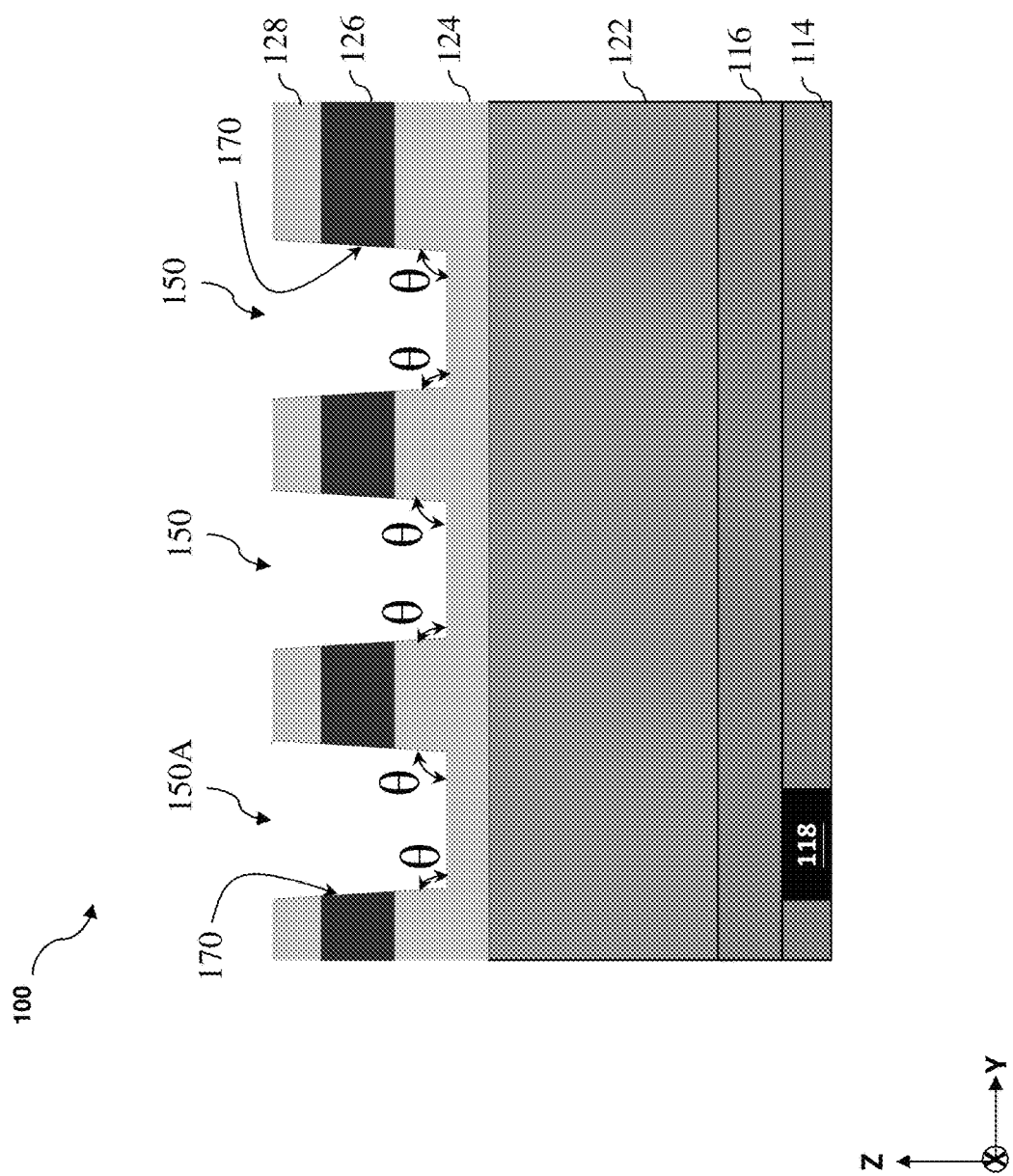

Referring to FIG. 3 and block 204 of FIG. 14, an etch stop layer 116 is formed over the dielectric layer 114 and over the via structure 118. In some embodiments, the etch stop layer 116 protects device features in a subsequent etching operation, as described below. The etch stop layer 116 may include any suitable materials, such as oxides, oxynitrides, nitrides, aluminum oxides, other suitable materials, or combinations thereof. The etch stop layer 116 may be formed by any suitable methods, such as CVD, ALD, PVD, other suitable methods, or combinations thereof.

Moreover, a dielectric layer 122 is formed over the etch stop layer 116. The dielectric layer 122 is subsequently removed, in its entirety, as described later. Accordingly, the dielectric layer 122 may be referred to as a sacrificial layer 122 or a dummy layer 122. In some embodiments, the sacrificial layer 122 includes silicon oxide, silicon nitride, silicon oxynitride, fluoride-doped silicate glass (FSG), a low-k dielectric material, an extremely-low-k dielectric material, other suitable materials, or combinations thereof. In some embodiments, the sacrificial layer 122 may include a high-k dielectric material, such as a dielectric material having a k-value greater than about 7. A sacrificial layer 122 having high-k dielectric material may be beneficial in some circumstances. For example, the sacrificial layer 122 is subsequently patterned. By including a high-k dielectric material, the patterning operation may be better controlled. For example, the sidewall surfaces may have better regulated inclination angles relative to the Z-direction. As described later, the inclination angles are important for the subsequent formation of air gaps between these sidewall surfaces.

Furthermore, mask layers 124 and 126 are formed over the sacrificial layer 122. In some embodiments, the mask layers 124 and 126 protects the device features in a subsequent etching operation. A patterned photoresist layer 128 may be further formed over the mask layers 126. The patterned photoresist layer 128 define regions to form metal line trenches. For example, the patterned photoresist layer 128 may have an opening in area above one or more of the via structures 118 along the Z-direction. Accordingly, as described below, further etching operations may expose the top surfaces of the via structure(s) 118.

The mask layers 124 and 126 are then patterned using the photoresist layer 128 as a template to form openings 150. In the depicted embodiment of FIG. 3, the opening 150 above the via structure 118 is referred to as the opening 150A. Because the openings 150 and 150A are subsequently deepened to form metal line trenches, they are also interchangeably referred to as the metal line trenches 150 or 150A. In some embodiments, the etching operation is configured to produce sidewall surfaces that are deviate from the vertical direction (or the Z-direction). For example, in some embodiments, the sidewall surfaces 170 of the openings 150 may be substantially straight. The sidewall surfaces 170 each span an angle θ from the Z-direction. In some embodiments, the angle θ is greater than 90°. For example, the angle θ may be about 92° to about 100°. The angle θ at least partially determines the inclination angle of sidewall surfaces of metal line trenches formed later. Having an angle θ that is too small or too large may both lead to excessive challenges in forming the air gaps 130, as described in more detail later, and lose benefits thereof. Any suitable etching methods may be used. In some embodiments, the etching operation may be an anisotropic dry etching operation, such as a reactive ion etching operation, implementing a suitable etchant such as $CF_4/O_2$, $CHF_3/O_2$, $CH_2F_2$, $CH_3F$, or the like.

Figure 4:
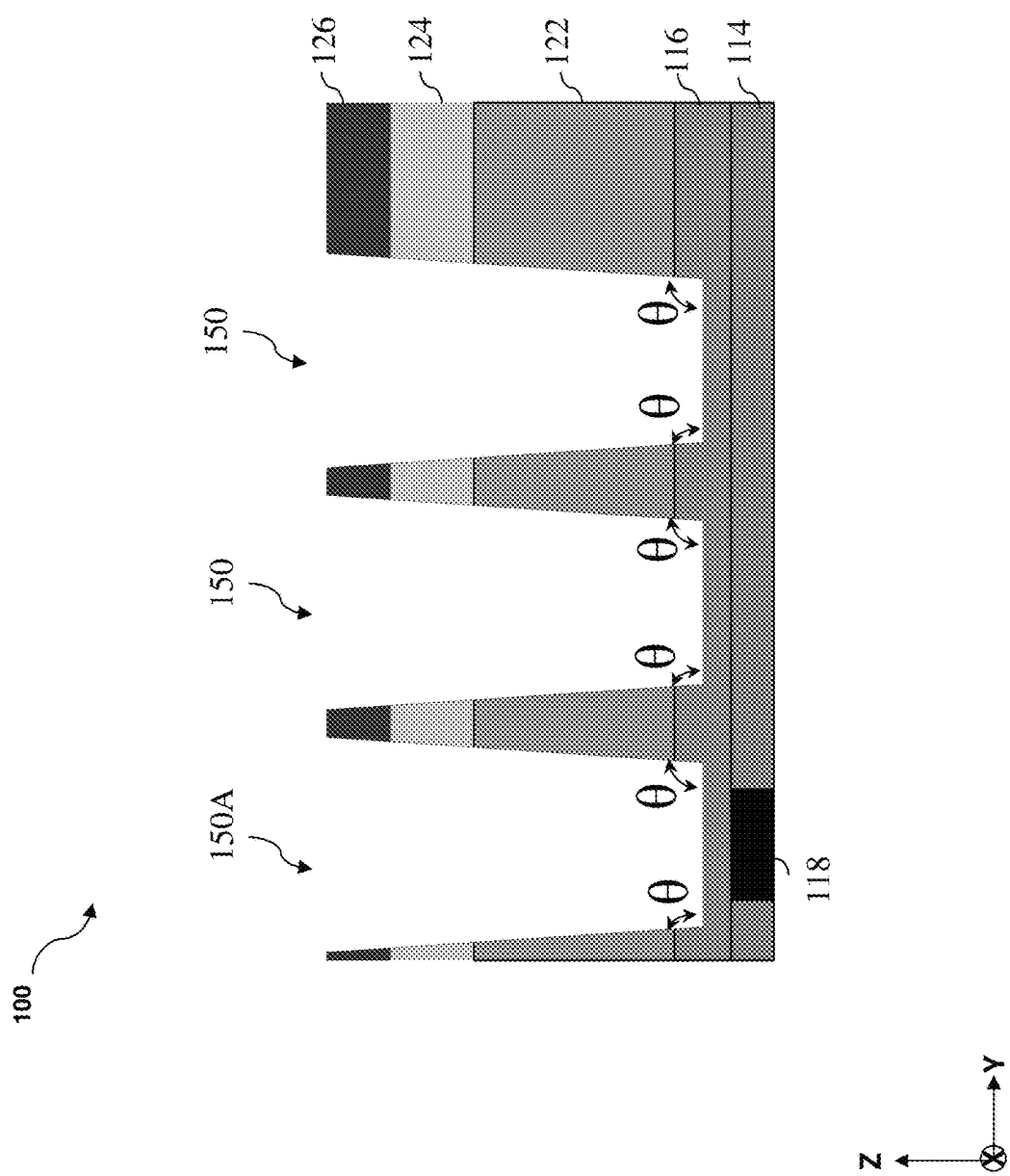

Referring to FIG. 4 and block 206 of FIG. 14, portions of the sacrificial layer 122 exposed by the mask layers 124 and 126 are removed to form metal line trenches 150 (including 150A). The removal may implement a dry etch process utilizing an etchant such as oxygen, nitrogen, hydrogen, ammonia, sulfur hexafluoride, difluoromethane, nitrogen trifluoride, chlorine trifluoride, chlorine, carbon monoxide, carbon dioxide, helium, boron dichloride, argon, fluorine, trifluoromethane, tetrafluoromethane, perfluorocyclobutane, perfluoropropane, other suitable etchants, or combinations thereof. As a result, the pattern of the photoresist layer 128 is transferred to the sacrificial layer 122. Moreover, the sidewall surfaces of the metal line trenches 150 and 150A preserve the angles θ relative to the vertical direction. In some embodiments, the removal process exposes the etch stop layer 116. Subsequently, a wet cleaning operation may be conducted to remove residues from the dry etching operation and clean the sidewall surfaces and bottom surfaces of the metal line trenches 150 and 150A.

Figure 5:
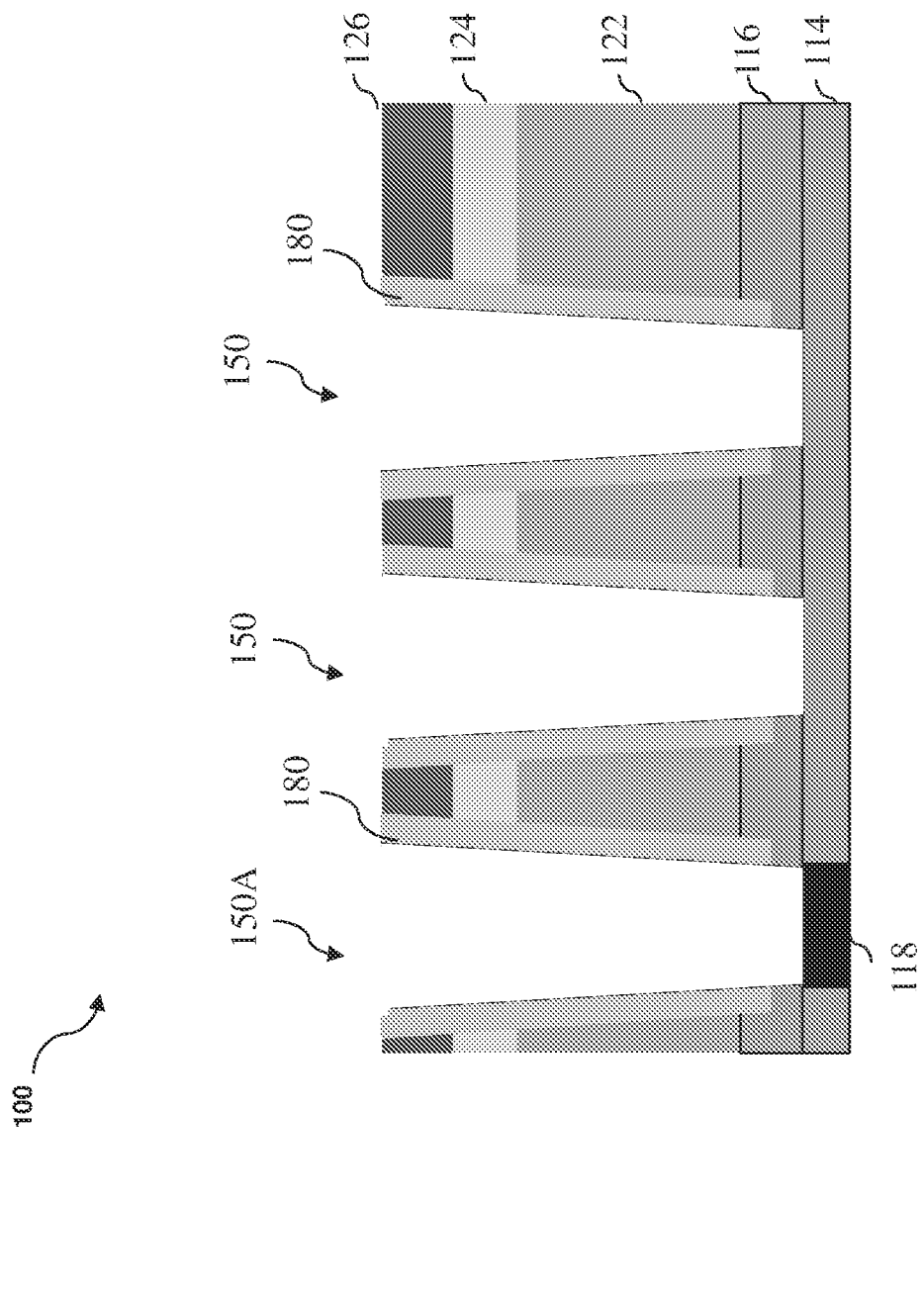

Referring to FIG. 5 and to block 208 of FIG. 14, the method 200 proceeds to form a protecting layer 180. In some embodiments, the protecting layer 180 protects the metal line feature (including the barrier seed layer thereon) in a subsequent etching operation of the sacrificial layer 122. Without the protecting layer 180, those features may be damaged leading to device performance degradations. The protecting layer 180 may be configured with a material that has a significantly different etch resistance from that of the sacrificial layer 122. In some embodiments, the protecting layer 180 may include silicon nitride, silicon oxycarbide, silicon carbonitride, silicon oxycarbonitride, other suitable materials, or combinations thereof. The protecting layer 180 may be formed by any suitable methods, such as an ALD, CVD, PVD, other suitable methods, or combinations thereof. In some embodiments, the protecting layer 180 may be a conformal layer. For example, the protecting layer 180 may have a same thickness of about 0.5 nm to about 5 nm. In some embodiments, the protecting layer 180 is etched back to remove the portions on top surfaces of the mask layers 126 and on bottom surfaces of the openings 150 (including 150A). Accordingly, the etch stop layer 116 is exposed in the metal line trenches 150. Subsequently, the etch stop layer 116 exposed in the metal line trenches 150 are removed such that top surface of the via structures 118 is exposed in the metal line trenches 150A. Meanwhile, the ILD layer 114 is exposed in the other metal line trenches 150. In some embodiments, a wet cleaning operation removes residues from the etching operations and clean the surfaces for subsequent depositions.

Figure 6:
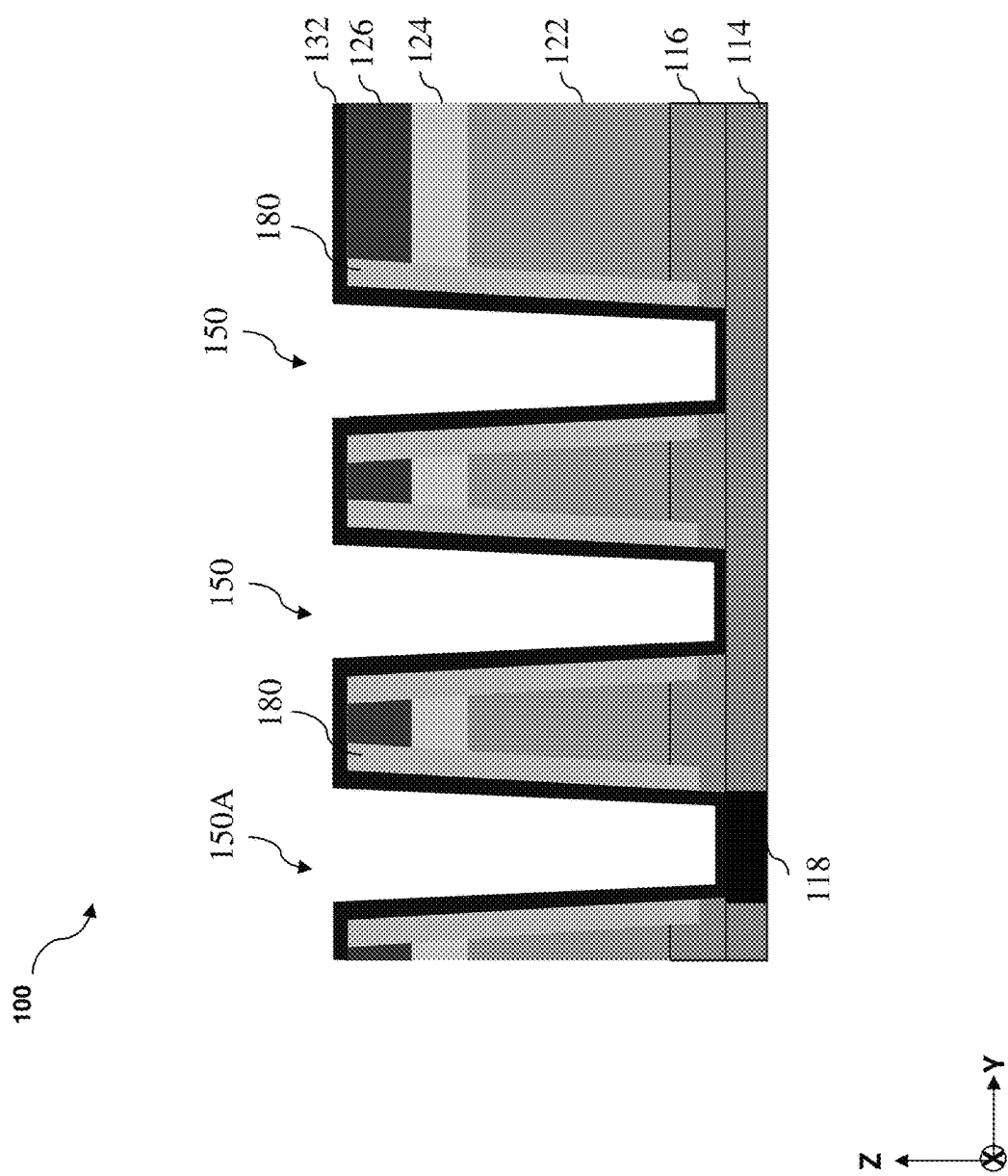
Figure 7:
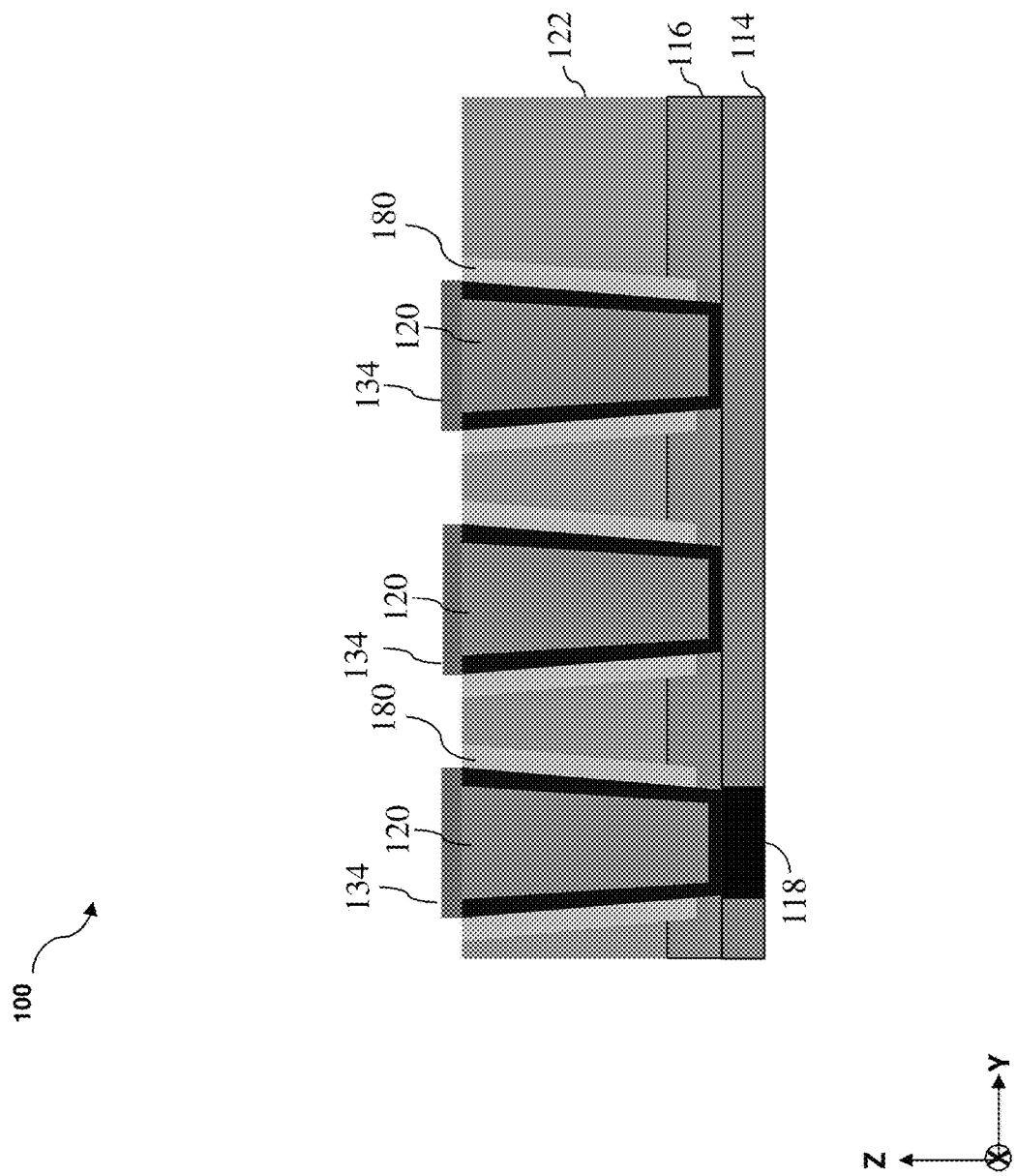

Referring to block 210 of FIG. 14, the method 200 proceeds to form metal lines. As illustrated in FIG. 6, a layer 132 (or a combination of layers 132). The layer 132 may include a diffusion barrier layer, a seed layer, or combinations thereof. The layer 132 may be formed by any suitable methods, such as PVD, CVD, ALD, other suitable methods or combinations thereof. In some embodiments, the layer 132 may include tantalum (Ta), tantalum nitride (TaN), titanium (Ti), titanium nitride (TiN), other suitable materials or combinations thereof. In some embodiments, the layer 132 may include a low resistance material, such as ruthenium (Ru), cobalt (Co). In some embodiments, the layer 132 may be of a thickness of about 1 nm to about 5 nm. Referring to FIG. 7, a conductive material (such as a metal material) is deposited into and filling the metal line trenches 150 (including the metal line trench 150A). In some embodiments, the conductive materials overfill the metal line trenches. Accordingly, a chemical mechanical polishing (CMP) process is conducted to remove the excess materials above the top surfaces of the sacrificial layers to form the metal lines 120. In other words, the metal lines 120 are formed in a damascene process. In some embodiments, the conductive material may include copper, aluminum, aluminum alloy, copper alloy, other suitable materials, or combinations thereof. In some embodiments, the metal lines are formed in other suitable methods. Moreover, the mask layers 124 and 126 are removed in the CMP operation. Furthermore, a capping layer 134 may be formed on top surfaces of the metal lines 120. For example, the capping layer 134 may include cobalt, tungsten, other suitable materials or combinations thereof. The capping layer protects the metal lines in subsequent etching operations.

Figure 8:
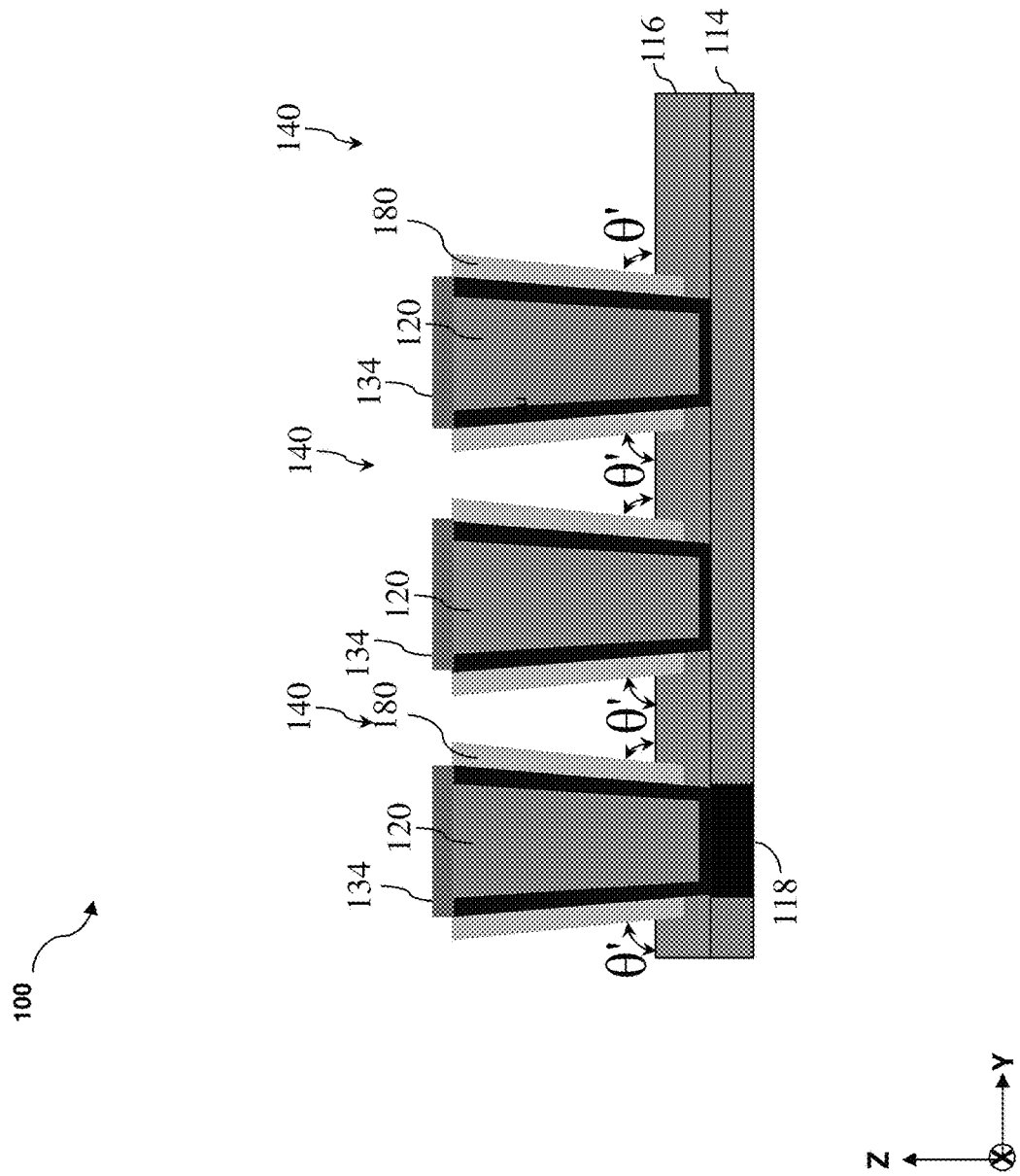

Referring to block 212 of FIG. 14 and to FIG. 8, remaining portions of sacrificial layer 122 is removed from the device 10, thereby exposing top surfaces of the etch stop layers 116, as well as exposing sidewall surfaces of the protecting layers 180. In some embodiments, the remaining portions of sacrificial layer 122 is removed using an dry etching operation. For example, the dry etching operation may implement an advanced chemical oxide removal (aCOR) process. In some embodiments, the aCOR process uses a pure reactive gas to react with materials on the surfaces of the sacrificial layer 122 to form labile materials, which is then removed by purging at an elevated temperature. In some embodiments, the reactive gas includes hydrogen fluoride, hydrogen chloride, ammonia, trifluoromethane, tetrafluoromethane, hexafluorosulfide, other suitable reactive gases, or combinations thereof. In some embodiments, the aCOR process is a radical-free process and further does not implement plasma, ion bombardments, or other types of bombardments. Accordingly, damages to the underlying surfaces, such as the sidewall surfaces of the metal lines 120 (which is also protected by the protecting layer 180) are mitigated. As compared to approaches not implementing methods of the present disclosure (such as not forming the protecting layers 180 and/or not implementing the aCOR process), the integrity of the metal lines 120 are improved. In some embodiments, the aCOR process is conducted at a temperature of about 50° C. to about 200° C., such as about 75° C. to about 150° C. If the temperature is too low, the chemical reaction between the reactive gas and the sacrificial layer 122 may not be efficient; if the temperature is too high, the reaction may be hard to control and features not intended to be targeted may be compromised. In some embodiments, the parameters of the aCOR process, such as the incubation time, may be controlled to achieve high selectivity between the protecting layers 180 and the sacrificial layer 122. Moreover, in some embodiments, the purging operation implements an inert gas, such as nitrogen gas, at a temperature of about 80° C. to about 300° C., such as about 110° C. to about 230° C. If the temperature is too low, the purging operation may not completely remove species adsorbed on the surfaces; while if the temperature is too high, undesirable thermal damages may occur. Following the purging operation, a wet cleaning operation may be conducted to remove residue materials on the exposed surfaces such as further deposition may be conducted on fresh device surfaces.

As illustrated in FIG. 8, the removal of the remaining portions of the sacrificial layer 122 forms openings 140 between adjacent metal lines 120. The openings 140 have sidewall surfaces defined by the protecting layers 180 and bottom surfaces defined by the etch stop layer 116. Moreover, the inclination angles θ' of the sidewall surfaces of the protecting layers 180 is determined by the angle θ. For example, the inclination angle θ' equals to a difference between 180° and the angle θ. Accordingly, the inclination angle θ' may be about 80° to about 88°. In other words, the openings 140 have a lateral dimension (along the Y-direction) that is smaller at the top than at the bottom. This configuration enables a restricted flow of materials into the openings 140 in a subsequent deposition operation.

Figure 9:
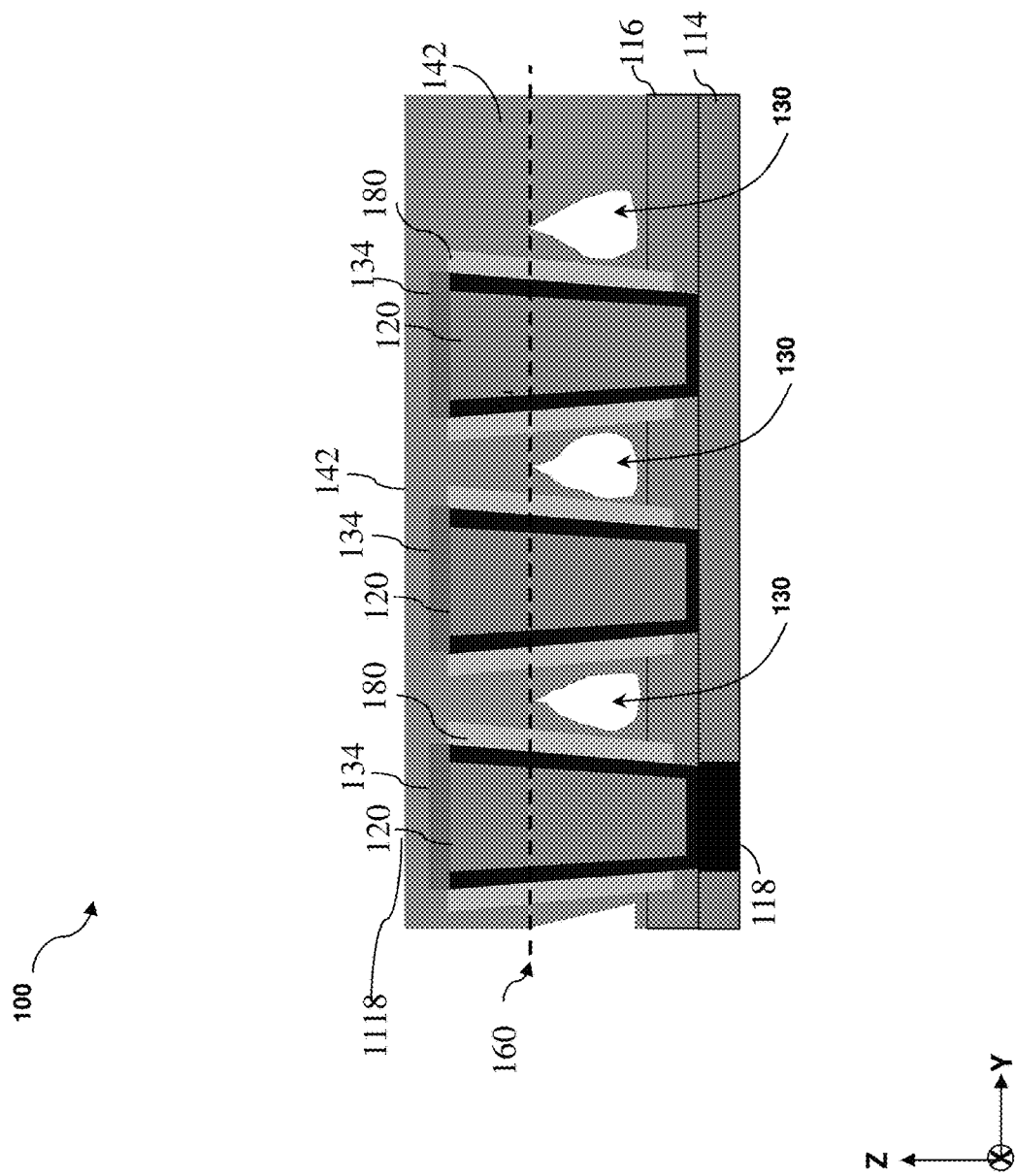

Referring to block 214 of FIG. 14 and to FIG. 9, a dielectric material is deposited into the openings 140, thereby forming a dielectric layer 142. In some embodiments, the dielectric material is a low-k dielectric material, such as a material having a k value less than about 7. In some embodiments, having a low-k material reduces the capacitances between adjacent metal lines and improves device characteristics. As illustrated in FIG. 9, the dielectric materials are formed on sidewall surfaces of the protecting layer 180, as well as on top surfaces of the etch stop layer 116. Moreover, air gaps 130 are formed between portions of the dielectric layer 142. In other words, the forming of the dielectric layer 142 encloses air gaps therebetween. In some embodiments, all air gaps 130 extend below a surface 160, although different air gaps 130 may have a distance from the surface 160 that is different from one another.

Subsequently, referring to block 216 of FIG. 14 and to FIG. 10, a CMP operation is conducted to remove excess dielectric materials on top surfaces of the metal lines 120. As a result of the CMP operation, the metal lines 120 are completed. In some embodiments, the CMP operation is configured to terminate before reaching the surface 160, such that the air gaps 130 remain enclosed. The metal liens 120 may have a height t1. In some embodiments, the height t1 of the metal lines 120 are controlled by a combination of detecting a material from the recessed capping layer 134 and controlling a time duration of CMP operation beyond the detection of recessed material from the capping layer 134. In some embodiments, the CMP operation is configured to terminate when the capping layer 134 is exposed. In some embodiments, the CMP operation is configured to further remove the capping layer 134. In some further embodiments, the CMP operation is configured to additionally reduces the height of the metal lines 120. Regardless, the CMP operation is configured to leaving the air gaps 130 enclosed. Accordingly, the air gaps 130 remain in the final structure of the device 10.

Figure 10:
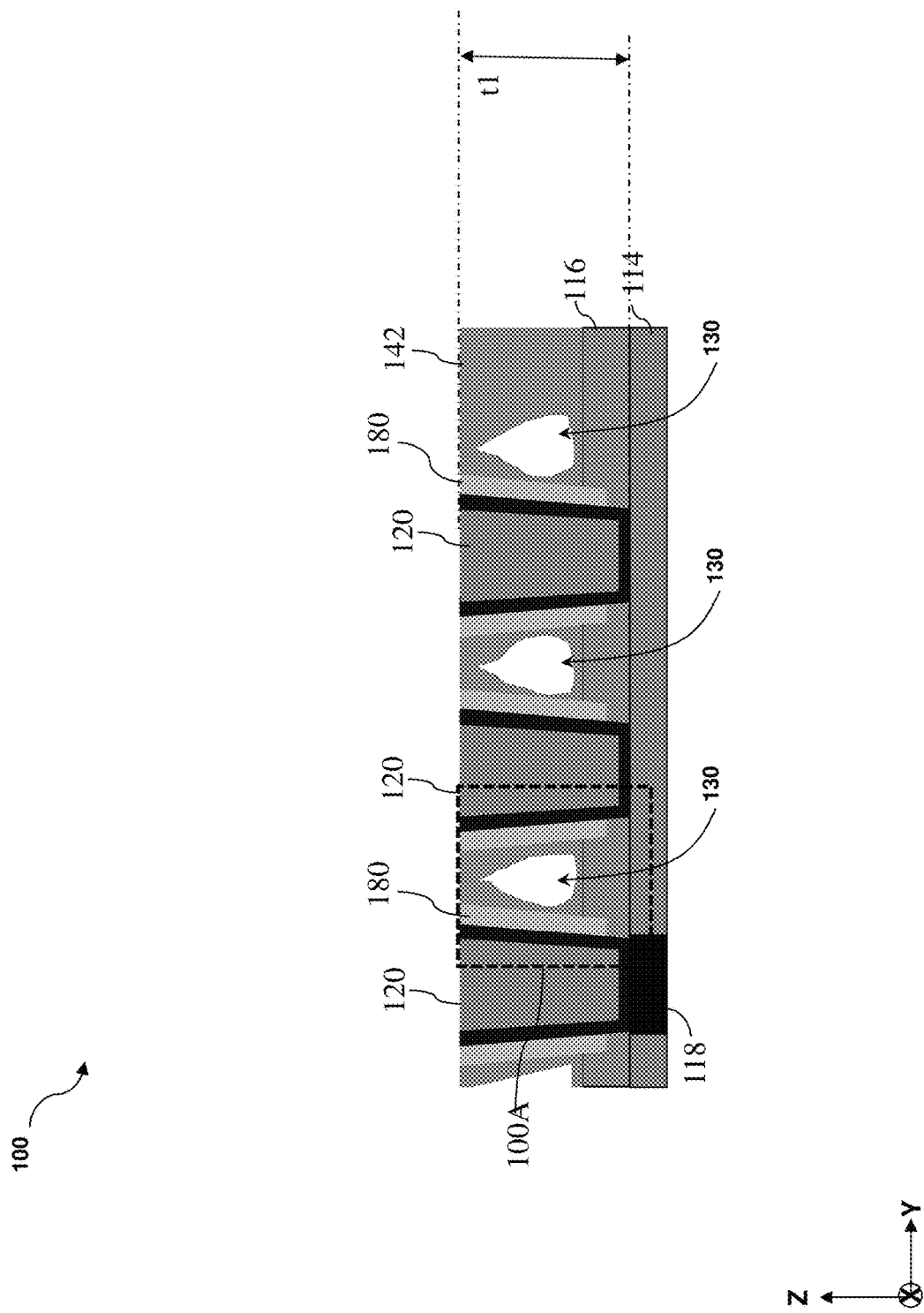
Figure 11:
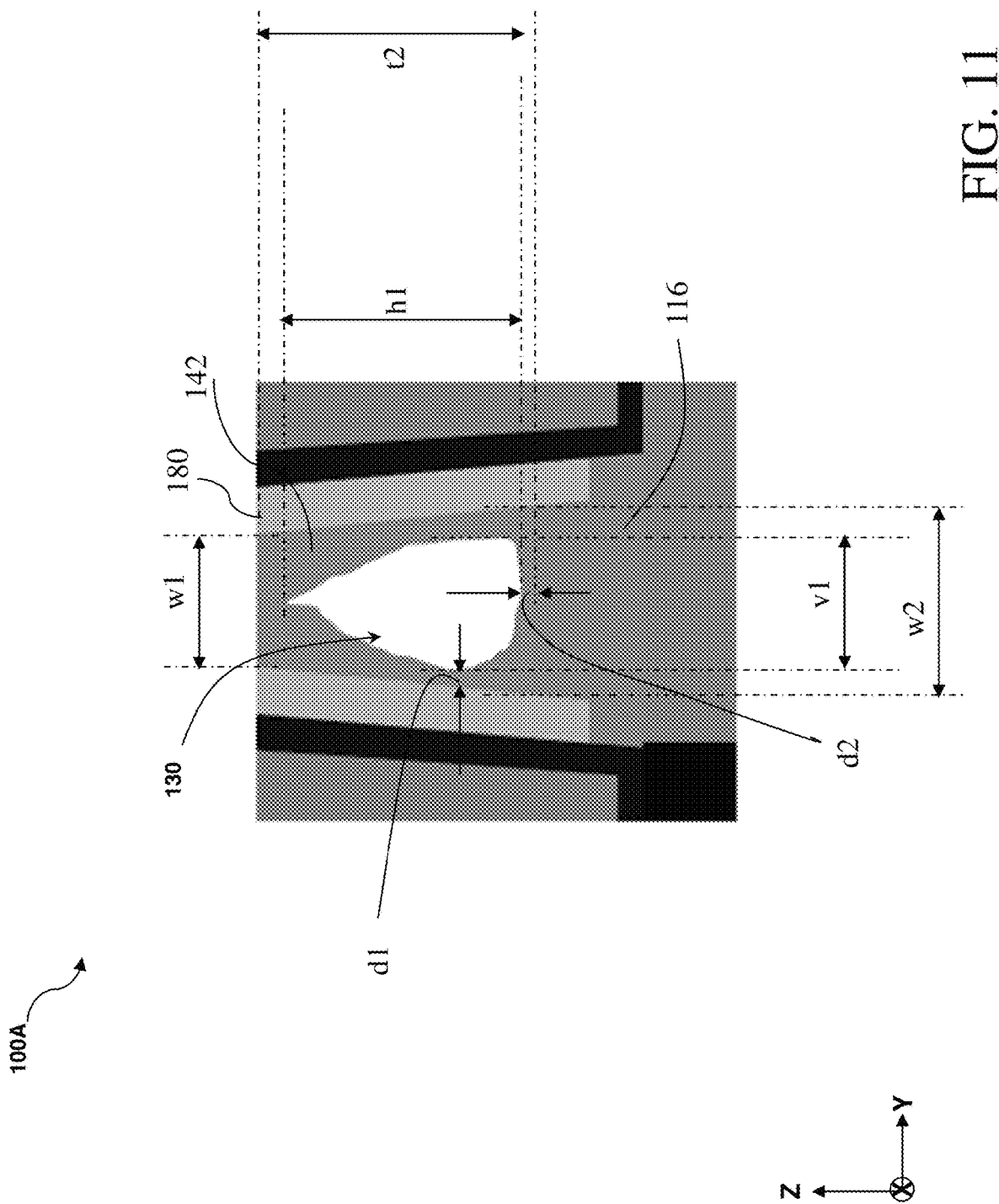

FIG. 11 illustrates an expanded view of the portion 100A of FIG. 10. As illustrated in FIG. 11, the air gaps 130 may have an irregular profile. For example, the air gap may be spaced away from the sidewall surface of the protecting layer 180 by a distance d1, and be spaced away from the etch stop layer 116 by a distance d2. In some embodiments, the d1 may be about 0.5 nm to about 3 nm. If the distance d1 is too small, the size of the air gaps 130 may be too large. Consequently, there may be insufficient dielectric materials on surfaces (including on top surface of the air gaps 130) to ensure that the air gaps 130 to stay enclosed at the conclusion of a subsequent CMP operation. If the distance d1 is too large, the volume of the air gaps 130 may be too small, such that capacitances between adjacent metal lines 120 may not be maximally reduced. In some embodiments, the distance d2 may be about 0.5 nm to about 3 nm. In some embodiments, the distance d2 is less than d1, for example, due to the longer diffusion path for the dielectric materials to reach the bottom of the openings 140. Alternatively, in some embodiments, the distance d2 may be zero. In other words, a portion of the etch stop layer 116 is exposed in the air gap 130. In some embodiments, the dielectric layer 142 has a top dimension w1 at the top surface (e.g. the top surface that is coplanar with the top surface of the metal lines 120). Moreover, the dielectric layer 142 has a bottom dimension w2 (e.g. at the interface between the dielectric layer 142 and the etch stop layer 116. As described above, because the protecting layer 180 has an inclination angle θ' that is less than the right angle, the dimension w1 is less than the dimension w2. In some embodiments, a ratio of w1 to w2 may be about 1:1.1 to about 1:2.5. If the ratio is too small, the top dimension for the openings 140 may be too small such that material access, during the formation of the dielectric layer 142, to lower portions of openings 140 may be too much restricted. Accordingly, air gap 130 may have excessively large volumes. As a result, it may be challenging to keep the air gaps 130 enclosed during the CMP operation. If the ratio is too large, the restriction to material flow may be insignificant during the formation of the dielectric layer 142. In other words, the material may easily access the bottom portions of the openings 140, such that no air gaps are formed. Furthermore, the air gaps 130 may have a lateral width v1 along the Y-direction and a vertical height h1 along the Z-direction. A ratio r1 of the lateral width v1 to the dimension w1 may be about 0.3 to about 1.1. The dielectric layer 142 may have a height t2. A ratio r2 of the vertical height h1 to the height t2 may be about 0.3 to about 0.9. If the ratio r1 or r2 is too small, the air gaps 130 may be too small to maximally reduce the capacitances; if the ratio r1 or r2 is too large, it may be challenging to keep the air gaps 130 enclosed. In other words, a subsequent deposition over the device 10 will remove any remaining air gaps. Referring back to FIG. 10, as described above, the air gaps 130 may have irregular shapes. Accordingly, the air gaps 130 may have different shapes between one and another. Moreover, the size and dimensions of the air gaps 130 may vary between one and another.

Figure 12:
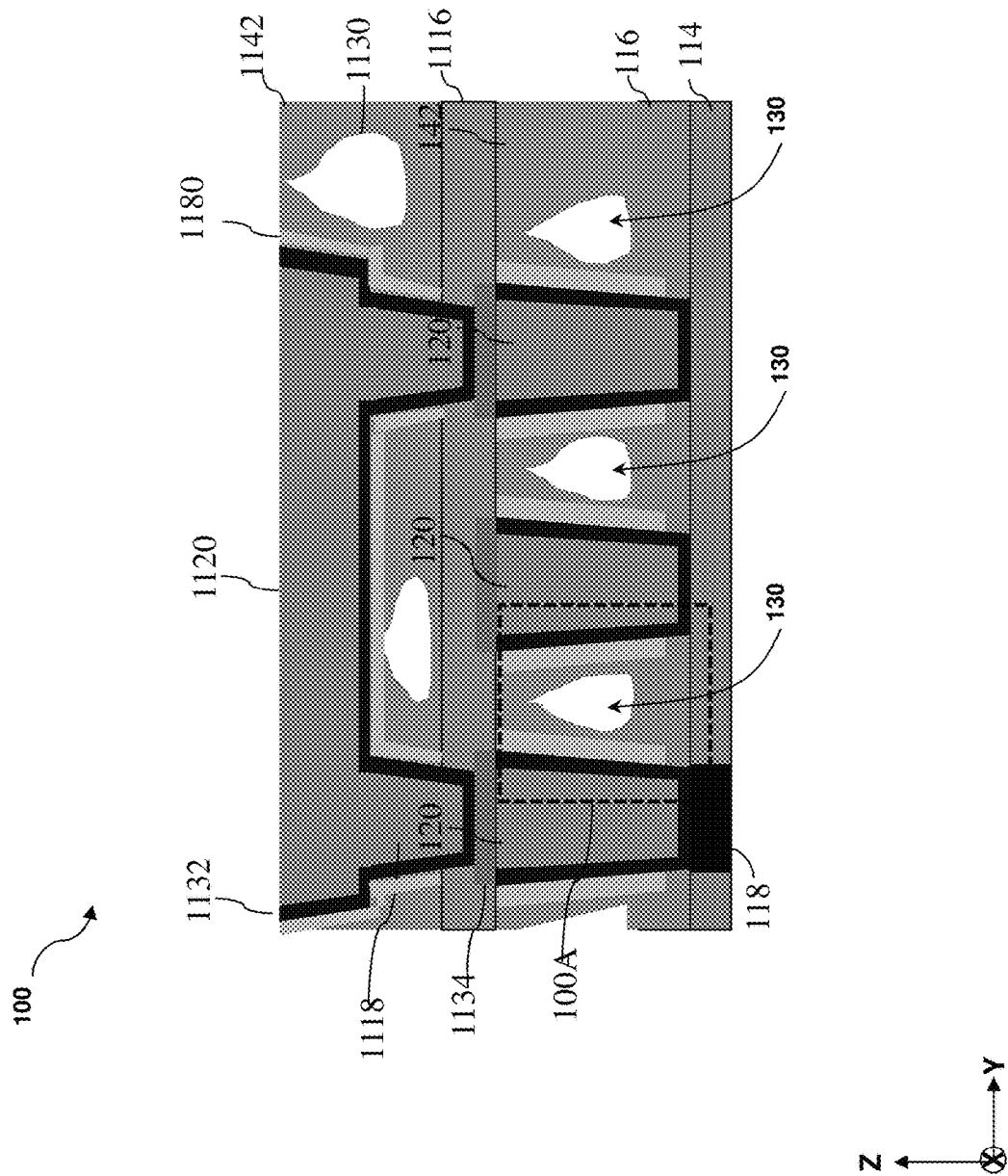

Although the disclosure above describes a single damascene process in forming the metal lines 130, alternatively, a dual damascene process or similar processes may be used. For example, FIG. 12 illustrates the application of dual damascene process. In some embodiments, the method 200 proceeds to form additional layers over the device 10. In some embodiments, another capping layer 1134 may be formed on top surfaces of the metal lines 120. The capping layer 1134 may be similar to the capping layer 134 described above. Another etch stop layer 1116 may be formed over the dielectric layer 142 and over the capping layers 1134. The etch stop layer 1116 may be similar to the etch stop layer 116 described above. The method 200 proceeds to repeat the steps described above with respect to blocks 204-216 of FIG. 14. Another sacrificial layer (not shown) may be formed over the etch stop layer 1116. Mask layers and photoresists may be formed above the sacrificial layer to define additional via trenches and additional metal lines trenches to be formed in the sacrificial layer. Portions of the sacrificial layer may be removed to form via trenches and metal line trenches, while controlling the parameters to ensure the inclination angles for the sidewall surfaces of the trenches are within the ranges described above for the angle θ. Additional protecting layers 1180 may be formed on sidewall surfaces of the metal line trenches and via trenches. Barrier and/or seed layers 1132 may be formed in the trenches. And a conductive material may be deposited to form the via structures 1118 along with the metal lines 1120. Subsequently, the sacrificial layers may be removed, for example, using an aCOR process, and another dielectric material is deposited to form the dielectric layer 1142. During the formation of the dielectric layer 1142, due to the inclination angles of the sidewalls of the via structures 1118 and metal lines 1120, depositing parameters may be controlled to form air gaps 1130 within the dielectric layer 1142. A subsequent CMP operation completes the formation of the metal lines 1120. Although not clearly depicted in FIG. 12, it is noted that air gaps may be formed in cross-sections not illustrated, such as between the metal line 1120 and another metal line 1120 extending in parallel to the depicted YZ cross-section.

Figure 13:
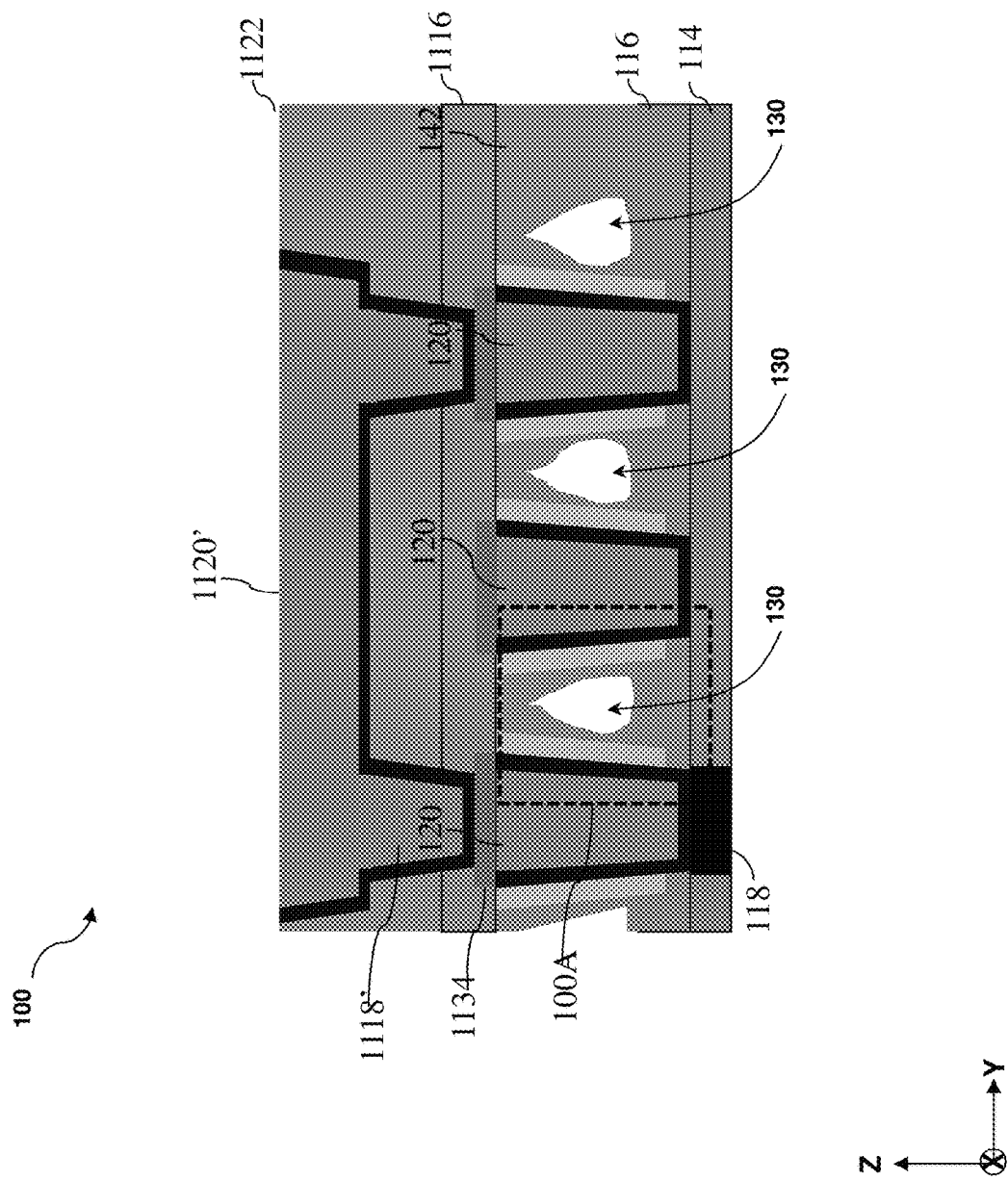

Alternatively, referring to FIG. 13, in some embodiments, subsequent layers formed over the device 10 may not implement the methods described above. Accordingly, dielectric layers 1122 may be first formed over the etch stop layer 1116. The dielectric layers 1122 may be patterned to define via trenches and metal line trenches. via features 1118' and metal lines 1120' may be formed therein within replacing the dielectric layer 1122. In such embodiments, the upper metal lines and via structures may not have protecting layers formed on the sidewall surfaces; and there may not be air gaps embedded within the dielectric layers 1122 that have sizes similar to those of air gaps 130. In other words, the upper layers of the metal lines and the lower layers of the metal lines may be different with respect to the presence or absence of the air gaps.

Referring to block 218 of the FIG. 14, the method 200 proceeds to complete the fabrication of the device. For example, additional metal lines, passivation features, other features may be formed over the device 10. Although the description above uses metal lines as example features between which air gaps may be formed, same or similar methods may be implemented to form air gaps between other conductive features, such as between vias, contacts, other conductive features, or the like. Further, additional steps can be provided before, during, and after the method 200, and some of the steps described can be replaced, relocated, or eliminated for other embodiments of the method 200.

It can be seen from the disclosure above that the IC device 10 has certain characteristics because of the unique process flow of the present disclosure. For example, air gaps of significant volumes are formed in the dielectric layers between adjacent metal lines. Moreover, protecting layers are formed on sidewall surfaces of the metal lines (such as on sidewall surfaces of the barrier or seed layers). Though not intended to be limiting, embodiments of the present disclosure offer benefits for semiconductor processing and semiconductor devices, as compared to conventional devices. For example, as compared to device fabricated without implementing the methods described herein, capacitances is reduced by about 10% to about 20%. Accordingly, device characteristics are substantially improved.

In one example aspect, the present disclosure is directed to a method. The method includes receiving a workpiece having a conductive feature over a semiconductor substrate, forming a sacrificial material layer over the conductive feature, removing first portions of the sacrificial material layer to form line trenches and to expose a top surface of the conductive feature in one of the line trenches; forming line features in the line trenches, removing second portions of the sacrificial material layer to form gaps between the line features, and forming dielectric features in the gaps, the dielectric features enclosing an air gap.

In some embodiments, the method further includes forming a protection layer on sidewalls of the line trenches, where the forming of the line features includes forming the line features on sidewall surfaces of the protection layer. In some embodiments, the protection layer serves as an etch stop in the removing of the second portions of the sacrificial material layer. In some embodiments, the removing of the first portions of the sacrificial material layer includes adjusting parameters to adjust an angle between sidewall surfaces of line trenches and a top surface of the semiconductor substrate. In some embodiments, the method further includes forming a capping layer on top surfaces of the line features. In some embodiments, the sacrificial material layer includes a material having a k value greater than about 7. In some embodiments, the removing of the second portions of the sacrificial material layer includes implementing a plasma-free etching process. In some embodiments, the method further includes conducting a chemical mechanical polishing (CMP) operation to reveal a top surface of the line features. In some embodiments, the conducting of the CMP operation includes adjusting a time duration to avoid reaching the enclosed air gaps.

In one example aspect, the present disclosure is directed to a method. The method includes receiving a semiconductor workpiece having first conductive features formed thereon, forming a sacrificial layer over the first conductive features, patterning the sacrificial layer to expose a top surface of the first conductive features, forming a protecting layer on the patterned sacrificial layer, forming second conductive features between adjacent portions of the patterned sacrificial layer; removing the patterned sacrificial layer, forming a dielectric layer between the adjacent second conductive features, and conducting a chemical mechanical polishing operation on the dielectric layer and on the second conductive features. The forming of the dielectric layer includes forming air gaps within the dielectric layer.

In some embodiments, the removing of the patterned sacrificial layer includes conducting a plasma-free etching operation. In some embodiments, the removing of the patterned sacrificial includes implementing a reacting gas free of radicals. In some embodiments, the removing of the patterned sacrificial includes adjusting an incubation time. In some embodiments, the patterning of the sacrificial layer includes adjusting parameters of patterning to control an inclination angle of sidewall surfaces of the patterned sacrificial layer. In some embodiments, the method further includes forming another sacrificial layer over the second conductive features, forming third conductive features within the another sacrificial layer, removing the another sacrificial layer; and forming another dielectric layer between adjacent third conductive features. Moreover, the forming of the another dielectric layer includes enclosing air gaps within the another dielectric layer. Implementations of the described techniques may include hardware, a method or process, or computer software on a computer-accessible medium.

In one example aspect, the present disclosure is directed to a device. The device includes a first conductive feature embedded within a first dielectric layer and electrically connected to a source/drain feature on a semiconductor substrate, a second conductive feature on and directly contacting the first conductive feature, a third conductive feature on the first dielectric layer, a second dielectric layer on the first dielectric layer; and an air gap between the second conductive feature and the third conductive feature and embedded within the second dielectric layer.

In some embodiments, the device further includes a protecting layer between the air gap and the second conductive feature, and between the air gap and the third conductive feature. In some embodiments, the second conductive feature has sidewall surfaces, where the sidewall surfaces each span an angle from a top surface of the semiconductor substrate. The angle is about 80° to about 88°. In some embodiments, the second dielectric layer has a portion between adjacent protecting layers. The portion has a lateral width w1 along a first direction on a top surface of the second dielectric layer. Moreover, the air gap has a maximum lateral width of v1 along the first direction. A ratio of v1 to w1 is about 0.3 to about 1.1. In some embodiments, the device further includes a third dielectric layer above the second dielectric layer, the second conductive feature, and the third conductive feature. Moreover, the device additionally includes a fourth conductive feature and a fifth conductive feature embedded within the third dielectric layer. Furthermore, the device also includes air gaps between the fourth conductive feature and the fifth conductive feature within the third dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method, comprising:
receiving a workpiece having a conductive feature over a semiconductor substrate;
forming an etch stop layer over the conductive feature;

forming a sacrificial material layer over the etch stop layer;
removing first portions of the sacrificial material layer to form line trenches partially extending into the etch stop layer;
conformally depositing a protection layer on sidewalls of the line trenches and a portion of the etch stop layer exposed in the line trenches;
etching back the protection layer to expose the portion of the etch stop layer exposed in the line trenches;
after the etching back, etching the portion of the etch stop layer to expose a top surface of the conductive feature in one of the line trenches;
forming line features in the line trenches, wherein the forming of the line features comprises:
depositing a diffusion barrier layer over the line trenches and in contact with the etch stop layer, the protection layer, and the top surface of the conductive feature, and
depositing a metal fill over the diffusion barrier layer;
removing second portions of the sacrificial material layer to form gaps between the line features; and
forming dielectric features in the gaps, the dielectric features enclosing an air gap.

2. The method of claim 1, wherein the protection layer serves as an etch stop in the removing of the second portions of the sacrificial material layer.

3. The method of claim 1, wherein the removing of the first portions of the sacrificial material layer includes adjusting parameters to adjust an angle between sidewall surfaces of line trenches and a top surface of the semiconductor substrate.

4. The method of claim 1, further comprising forming a capping layer on top surfaces of the line features.

5. The method of claim 1, wherein the sacrificial material layer includes a material having a k value greater than about 7.

6. The method of claim 1, wherein the removing of the second portions of the sacrificial material layer includes implementing a plasma-free etching process.

7. The method of claim 1, further comprising conducting a chemical mechanical polishing (CMP) operation to reveal a top surface of the line features.

8. The method of claim 7, wherein the conducting of the CMP operation includes adjusting a time duration to avoid reaching the enclosed air gaps.

9. A method, comprising:
receiving a semiconductor workpiece having a first conductive feature formed thereon;
forming an etch stop layer over the first conductive feature;
forming a sacrificial layer over the etch stop layer;
patterning the sacrificial layer to expose a portion of the etch stop layer;
forming a protecting layer on the patterned sacrificial layer and the exposed portion of the etch stop layer;
etching back the protecting layer to expose the exposed portion of the etch stop layer;
after the etching back, etching the exposed portion of the etch stop layer to expose a top surface of the first conductive feature;
forming second conductive features between adjacent portions of the patterned sacrificial layer;
removing the patterned sacrificial layer;
forming a dielectric layer between the adjacent second conductive features; and
conducting a chemical mechanical polishing operation on the dielectric layer and on the second conductive features,
wherein the forming of the dielectric layer includes forming air gaps within the dielectric layer.

10. The method of claim 9, wherein the removing of the patterned sacrificial layer includes conducting a plasma-free etching operation.

11. The method of claim 9, wherein the removing of the patterned sacrificial includes implementing a reacting gas free of radicals.

12. The method of claim 9, wherein the removing of the patterned sacrificial includes adjusting an incubation time.

13. The method of claim 9, wherein the patterning of the sacrificial layer includes adjusting parameters of patterning to control an inclination angle of sidewall surfaces of the patterned sacrificial layer.

14. The method of claim 9, further comprising:
forming another sacrificial layer over the second conductive features;
forming third conductive features within the another sacrificial layer;
removing the another sacrificial layer; and
forming another dielectric layer between adjacent third conductive features,
wherein the forming of the another dielectric layer includes enclosing air gaps within the another dielectric layer.

15. A method, comprising:
receiving a workpiece having a conductive feature disposed in a dielectric layer;
depositing an etch stop layer (ESL) over the workpiece;
depositing a sacrificial layer over the ESL;
forming a trench completely through the sacrificial layer and partially through the ESL while the conductive feature remains covered by a portion of the ESL;
after the forming of the trench, depositing a protecting layer over the trench and the ESL;
etching back the protecting layer to expose the portion of the ESL covering the conductive feature while sidewalls of the trench remain covered by the protecting layer;
after the etching back, etching the portion of the ESL to expose the conductive feature;
conformally depositing a barrier layer over the protecting layer and the exposed conductive feature;
after the conformally depositing, form a metal line in the trench;
depositing a capping layer over the metal line;
after the depositing of the capping layer, selectively removing the sacrificial layer to form openings that expose the ESL and the protecting layer; and
depositing a low-k dielectric layer over the openings.

16. The method of claim 15, wherein, after the depositing of the low-k dielectric layer, the low-k dielectric layer is disposed on top surfaces of the capping layer and the protecting layer and is in contact with sidewalls of the protecting layer and top surfaces of the ESL.

17. The method of claim 15, wherein the depositing of the low-k dielectric layer comprises forming air gaps in the low-k dielectric layer.

18. The method of claim 15, wherein the protecting layer comprises silicon nitride, silicon oxycarbide, silicon carbonitride, or silicon oxycarbonitride.

19. The method of claim 15, wherein the capping layer comprises cobalt or tungsten.

20. The method of claim 1,
wherein the protection layer comprises silicon nitride, silicon oxycarbide, silicon carbonitride, or silicon oxycarbonitride,
wherein the diffusion barrier layer comprises tantalum (Ta), tantalum nitride (TaN), titanium (Ti), titanium nitride (TiN), ruthenium (Ru), or cobalt (Co).

* * * * *